United States Patent
Onaka

(10) Patent No.: US 10,355,452 B2
(45) Date of Patent: Jul. 16, 2019

(54) OPTICAL MODULE AND METHOD FOR CONTROLLING OPTICAL MODULE

(71) Applicant: FUJITSU LIMITED, Kawasaki-shi, Kanagawa (JP)

(72) Inventor: Miki Onaka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/035,647

(22) Filed: Jul. 15, 2018

(65) Prior Publication Data
US 2019/0052056 A1    Feb. 14, 2019

(30) Foreign Application Priority Data
Aug. 14, 2017 (JP) .................................. 2017-156596

(51) Int. Cl.
| | |
|---|---|
| G02B 6/12 | (2006.01) |
| H01S 5/125 | (2006.01) |
| G02B 27/14 | (2006.01) |
| F21V 8/00 | (2006.01) |
| G02B 6/10 | (2006.01) |
| G02B 5/30 | (2006.01) |

(52) U.S. Cl.
CPC ............ *H01S 5/125* (2013.01); *G02B 5/3025* (2013.01); *G02B 6/0006* (2013.01); *G02B 6/105* (2013.01); *G02B 27/14* (2013.01)

(58) Field of Classification Search
CPC ....... H01S 5/125; G02B 5/3025; G02B 6/105; G02B 27/14; G02B 6/0006
See application file for complete search history.

(56) References Cited

U.S. PATENT DOCUMENTS

| | | | | |
|---|---|---|---|---|
| 9,464,883 | B2 * | 10/2016 | Swanson | ............ G01B 9/02091 |
| 2010/0178056 | A1 * | 7/2010 | Liu | ........................ H04B 10/61 |
| | | | | 398/65 |
| 2015/0188639 | A1 * | 7/2015 | Akashi | ............ H04B 10/50575 |
| | | | | 398/197 |
| 2018/0066931 | A1 * | 3/2018 | Swanson | ............ G01B 9/02091 |
| 2018/0364356 | A1 * | 12/2018 | Eichenholz | ........... G01S 17/105 |

FOREIGN PATENT DOCUMENTS

| | | |
|---|---|---|
| JP | 2003-283012 | 10/2003 |
| JP | 2006-074016 | 3/2006 |
| JP | 2014-157181 | 8/2014 |

\* cited by examiner

*Primary Examiner* — Ellen E Kim
(74) *Attorney, Agent, or Firm* — Fujitsu Patent Center

(57) ABSTRACT

An optical module includes a light source; a demultiplexer configured to demultiplex a light into a transmission light and a local light; an optical modulator; an excitation light source; an optical waveguide substrate that includes: a polarization beam splitter configured to split a reception light into an X-polarized component and a Y-polarized component, a beam splitter, a pair of optical hybrid circuits configured to cause the X-polarized component and the Y-polarized component to interfere with the local light split by the beam splitter, a pair of local light waveguides configured to couple the beam splitter and the pair of optical hybrid circuits, a pair of reception light waveguides configured to couple the polarization beam splitter and the pair of optical hybrid circuits, wherein the pair of local light waveguides and the transmission light waveguide are doped with a rare-earth ion that amplifies a light when the excitation light is introduced.

8 Claims, 14 Drawing Sheets

OPTICAL MODULE AND METHOD FOR CONTROLLING OPTICAL MODULE

CROSS-REFERENCE TO RELATED APPLICATION

This application is based upon and claims the benefit of priority of the prior Japanese Patent Application No. 2017-156596, filed on Aug. 14, 2017, the entire contents of which are incorporated herein by reference.

FIELD

The embodiments discussed herein are related to an optical module and a method for controlling an optical module.

BACKGROUND

In a high-speed (e.g., 100 GbpS) optical transmission system, a digital coherent optical transceiver that has an optical waveguide substrate configured such that various optical elements are provided on a semiconductor substrate is used (see, for example, Japanese Laid-open Patent Publication No. 2014-157181). It is known that an optical waveguide provided on an optical waveguide substrate is doped with erbium (Er) and the erbium-doped optical waveguide is used as an amplifier (see, for example, Japanese Laid-open Patent Publication No. 2006-74016 and Japanese Laid-open Patent Publication No. 2003-283012). An optical waveguide substrate configured such that various optical elements are provided on a semiconductor substrate is also called a planar waveguide. The planar waveguide is a substrate on which optical elements such as a polarization-beam splitter (PBS) and an optical 90-degree hybrid circuit are provided. Use of a planar waveguide configured such that a plurality of elements can be provided on a single substrate allows a reduction in size of a digital coherent optical transceiver including an optical receiver.

A digital coherent optical transceiver can be further reduced in size and power consumption by using light output from a light source as transmission light and using, as local light, part of the light split by using a beam splitter. Use of part of the transmission light as local light keeps light output power of the transmission light from decreasing, and therefore the transmission light is amplified by an amplifier such as an erbium-doped fiber amplifier (EDFA) after being modulated by an optical modulator. The EDFA includes an erbium-doped optical fiber having a length of several meters and having a core doped with an erbium ion ($Er^{+3}$). The EDFA is an amplifier that amplifies light in a 1.55 μm band by exciting an erbium ion ($Er^{+3}$) by using excitation light. The transmission light output from the light source is modulated by the optical modulator and is then multiplexed with the excitation light and amplified by the EDFA. In this way, desired light amplification characteristics are achieved.

However, an erbium-doped optical fiber included in an EDFA typically has a length of several meters. It is therefore not easy to reduce a size of a digital coherent optical transceiver that amplifies transmission light by using an EDFA. In view of such circumstances, it is desirable that an optical module has a small size and has good light amplification characteristics.

SUMMARY

According to an aspect of the invention, an optical module comprising: a light source; a demultiplexer configured to demultiplex a light emitted from the light source into a transmission light and a local light; an optical modulator configured to modulate the transmission light; an optical waveguide substrate configured to receive the transmission light modulated by the optical modulator, the local light, and reception light; an excitation light source configured to introduce an excitation light into the optical waveguide substrate; wherein the optical waveguide substrate includes: a polarization beam splitter configured to split the reception light into an X-polarized component and a Y-polarized component orthogonal to the X-polarized component, a beam splitter configured to split the local light, a pair of optical hybrid circuits configured to cause the X-polarized component and the Y-polarized component to interfere with the local light thus split, respectively, a pair of local light waveguides configured to couple the beam splitter and the pair of optical hybrid circuits, a pair of reception light waveguides configured to couple the polarization beam splitter and the pair of optical hybrid circuits, and a transmission light waveguide which the transmission light passes, wherein the pair of local light waveguides and the transmission light waveguide are doped with a rare-earth ion that amplifies light having a predetermined frequency when the excitation light is introduced.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An optical module according to embodiments is described below with reference to the drawings. Note, however, that the technical range of the present disclosure is not limited to these embodiments.

Optical Module Relevant to Optical Module According to Embodiments

An optical module relevant to an optical module according to the embodiments is described before description of the optical module according to the embodiments.

Figure 1A:
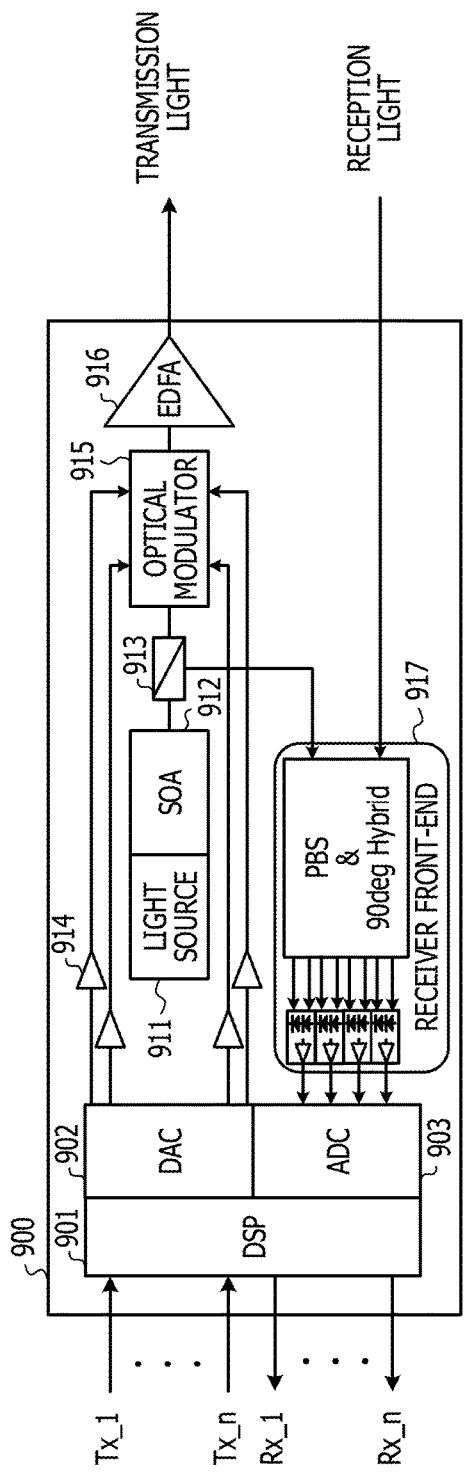
FIG. 1A is a block diagram of a digital coherent optical transceiver including a receiver front-end that is an example of a relevant optical receiver.
Figure 1B:
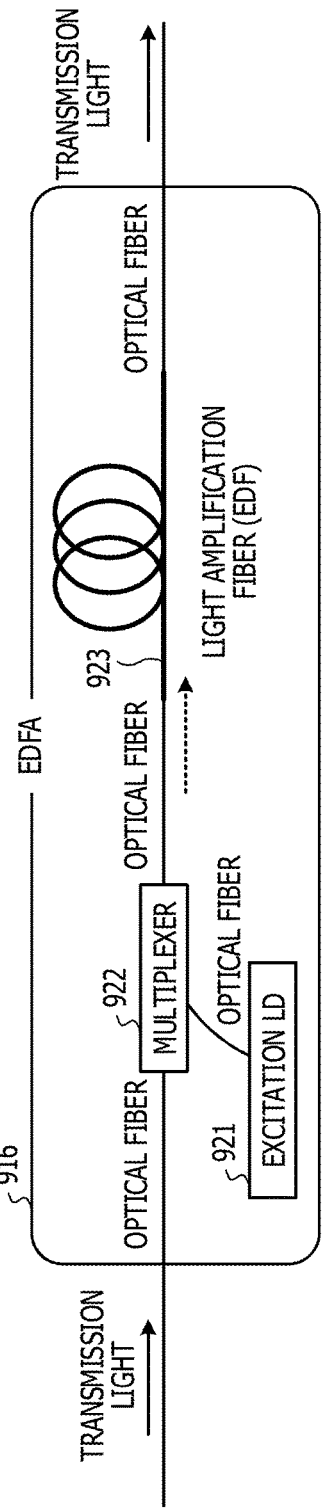
FIG. 1B is an internal block diagram of an EDFA illustrated in FIG. 1A.

FIG. 1A is a block diagram illustrating a digital coherent optical transceiver that is an example of the relevant optical module. FIG. 1B is an internal block diagram of an EDFA illustrated in FIG. 1A.

A digital coherent optical transceiver 900 includes a digital signal processor (DSP) 901, a digital analog converter 902, and an analog digital converter 903. The digital coherent optical transceiver 900 further includes a light source 911, a semiconductor optical amplifier (SOA) 912, a beam splitter 913, a modulation driver 914, an optical modulator 915, and an EDFA 916. The digital coherent optical transceiver 900 further includes a receiver front-end 917.

The DSP 901 receives digital transmission signals Tx1 to Tx_n, performs predetermined processing on data that corresponds to the received digital transmission signals Tx1 to Tx_n, and supplies digital transmission signals indicative of the data that has been subjected to the predetermined processing to the digital analog converter 902. The DSP 901 receives digital reception signals from the analog digital converter 903, performs predetermined processing on data that corresponds to the received digital reception signals, and supplies digital reception signals Rx1 to Rx_n indicative of the data that has been subjected to the predetermined processing. The DSP 901 may compute an error rate indicative of a rate of occurrence of an error in a signal that corresponds to reception light from the digital reception signals Rx1 to Rx_n. Alternatively, the DSP 901 may compute an error count indicative of the number of times of occurrence of an error in a signal that corresponds to reception light. The digital analog converter 902 generates analog transmission signals by digital-analog conversion of the digital transmission signals received from the DSP 901 and supplies the generated analog transmission signals to the modulation driver 914. The analog digital converter 903 generates digital transmission signals by analog-digital conversion of analog reception signals received from the receiver front-end 917 and supplies the generated digital reception signals to the DSP 901

The light source 911 is, for example, a distributed feedback (DFB) laser, a sampled grating-distributed bragg reflector (SG-DBR) laser, or a ring resonator laser. The light source 911 is a laser that outputs coherent light having desired optical characteristics. The coherent light output from the light source 911 is, for example, light in a 1.55 μm band.

The SOA 912 is an amplifier that is made of a semiconductor material such as GaAs/AlGaAs and amplifies coherent light received from the light source 911. The beam splitter 913 is, for example, a pair of prisms whose inclined surfaces are joined to each other. The beam splitter 913 splits the coherent light amplified by the SOA 912 into two light beams at a ratio of 1:1. The beam splitter 913 supplies one of the two light beams to the optical modulator 915 and supplies the other one of the two light beams to the receiver front-end 917. The modulation driver 914 supplies the analog transmission signals received from the digital analog converter 902 to the optical modulator 915. The optical modulator 915 modulates the coherent light output from the light source 911 based on the analog transmission signals received via the modulation driver 914 and supplies the modulated light thus obtained to the EDFA 916. The optical modulator 915 generates the modulated light, for example, by dual polarization-quadrature phase shift keying (DP-QPSK) of the coherent light. Structures and functions of the SOA 912, the beam splitter 913, the modulation driver 914, and the optical modulator 915 are widely known, and therefore detailed description thereof is omitted.

The EDFA 916 includes an excitation light laser 921, a multiplexer 922, and a light amplification fiber 923. The excitation light laser 921 is, for example, a distributed feedback laser, an SG-DBR laser, or a ring resonator laser. The excitation light laser 921 generates excitation light for exciting an erbium ion ($Er^{+3}$) in a 0.98 μm band or a 1.48 μm band and supplies the generated excitation light to the multiplexer 922. The multiplexer 922 is, for example, a WDM coupler. The multiplexer 922 multiplexes the modulated light supplied from the optical modulator 915 and the excitation light supplied from the excitation light laser 921 and supplies the light thus obtained to the light amplification fiber 923. The light amplification fiber 923 is, for example, an optical fiber having a length of several meters and having a core doped with an erbium ion ($Er^{+3}$). The light amplification fiber 923 is an amplifier that amplifies light in a 1.55 μm band upon receipt of the excitation light from the excitation light laser 921.

Figure 2:
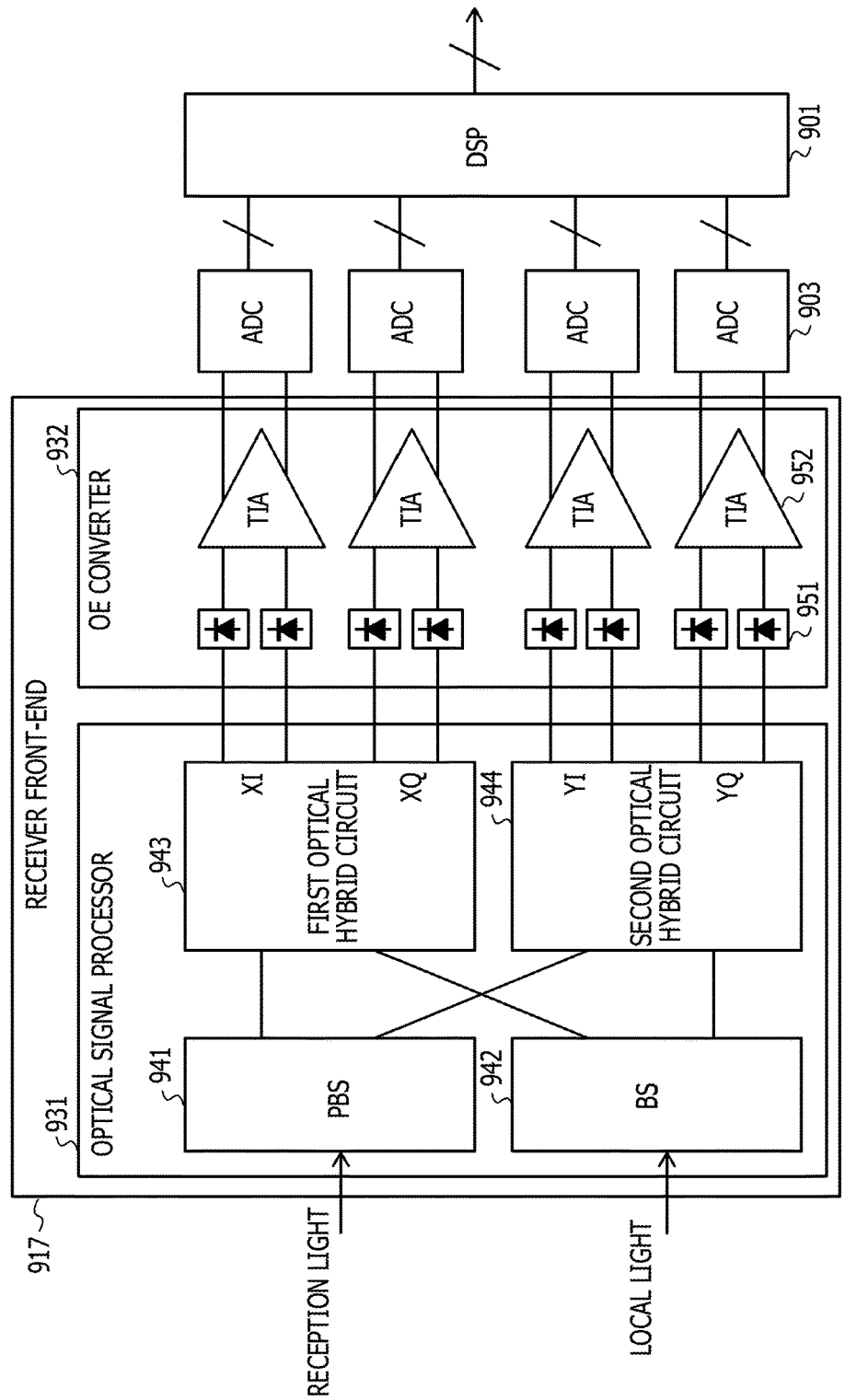
FIG. 2 is an internal block diagram of the receiver front-end illustrated in FIG. 1A.

FIG. 2 is an internal block diagram of the receiver front-end 917.

The receiver front-end 917 is a planar waveguide on which a plurality of optical elements are provided. The receiver front-end 917 includes an optical signal processor 931 that demodulates reception light modulated, for example, by DP-QPSK and an OE converter 932 that converts an optical signal demodulated by the optical signal processor into an electric signal.

The optical signal processor 931 includes a polarization beam splitter 941, a beam splitter 942, and a first optical hybrid circuit 943 and a second optical hybrid circuit 944 that are a pair of optical 90-degree hybrid circuits. The optical signal processor 931 splits the received reception light into an I-channel phase component XI and a Q-channel phase component XQ of an X-polarized component that are orthogonal to each other and an I-channel phase component YI and a Q-channel phase component YQ of a Y-polarized component that is orthogonal to the X-polarized component. Structures and functions of the polarization beam splitter 941, the beam splitter 942, the first optical hybrid circuit 943, and the second optical hybrid circuit 944 are widely known, and therefore detailed description thereof is omitted.

The OE converter 932 includes four pairs of photo diodes 951 and four trans impedance amplifiers (TIAs) 952. The OE converter 932 converts four optical signals XI, XQ, YI, and YQ split from the reception light by the optical signal processor 931 into electric signals and supplies the converted electric signals to the analog digital converter 903.

Structures and functions of the photo diodes 951 and TIAs 952 are widely known, and therefore detailed description thereof is omitted.

The digital coherent optical transceiver 900 can be reduced in size and power consumption by splitting the light output from the light source 911 into light beams by using the beam splitter 913 and using one of the light beams as local light. The digital coherent optical transceiver 900 can keep light output power of transmission light from decreasing since the transmission light modulated by the optical modulator 915 is amplified by the EDFA 916.

However, it is not easy to reduce a size of the digital coherent optical transceiver since the light amplification fiber 923 included in the EDFA 916 has a length of several meters.

Outline of Optical Module According to Embodiments

An optical module according to the embodiments can have a small size and obtain good light amplification characteristics since both of local light and transmission light are amplified by using an optical waveguide substrate on which an optical waveguide doped with a rare-earth ion that amplifies light of a predetermined frequency by introduction of excitation light.

Configuration and Function of Optical Module According to First Embodiment

Figure 3:
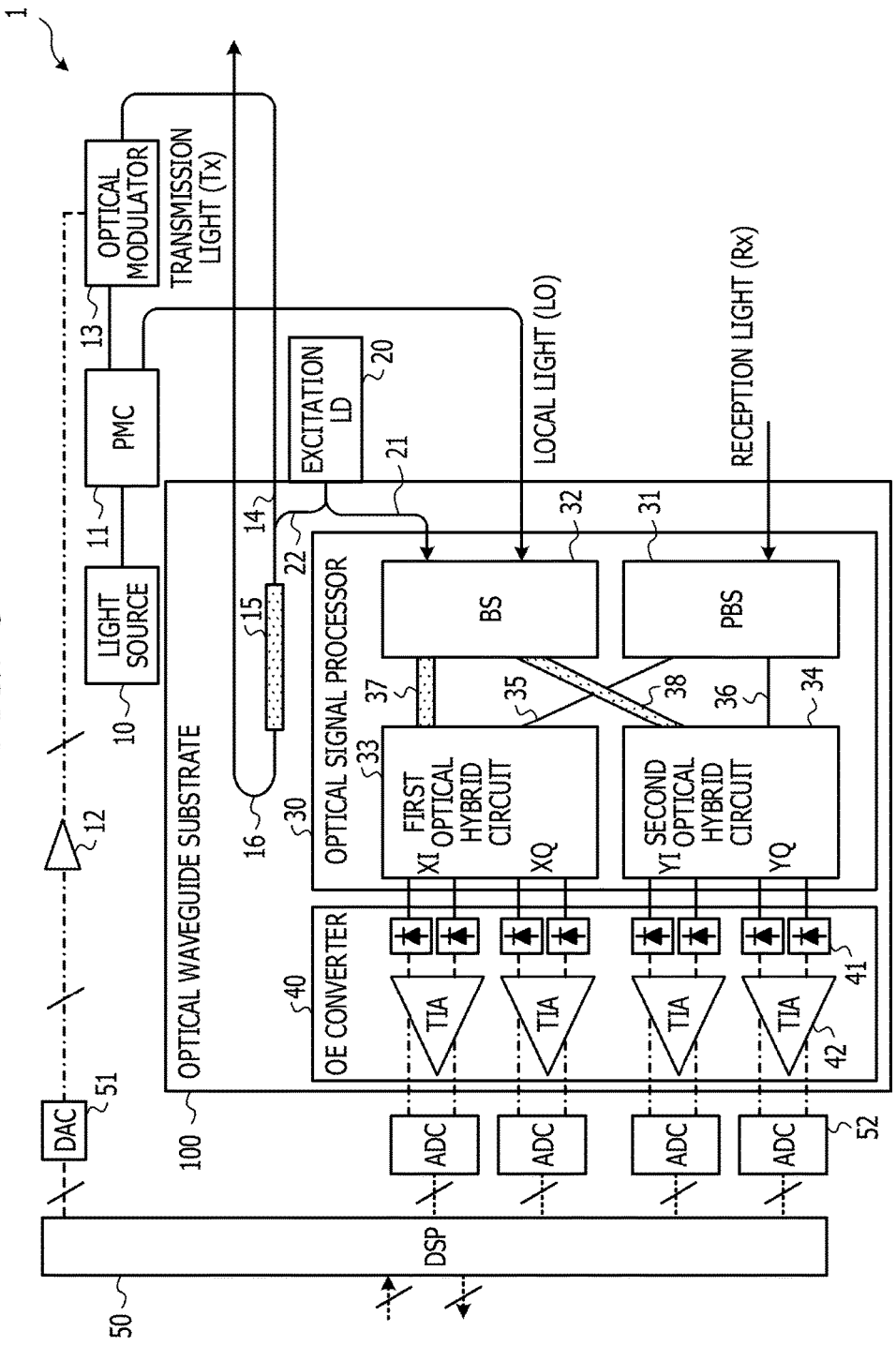
FIG. 3 is a block diagram of a module according to a first embodiment.

FIG. 3 is a block diagram of a module according to a first embodiment. In FIG. 3, an optical signal is indicated by the solid line, and an electric signal is indicated by a line with alternate long and short dashes.

An optical module 1 includes a light source 10, a PMC 11, a modulation driver 12, an optical modulator 13, an excitation laser 20, a DSP 50, a digital analog converter 51, an analog digital converter 52, and an optical waveguide substrate 100. The optical module 1 is, for example, a digital coherent optical transceiver.

Configurations and functions of the light source 10 and the modulation driver 12 are similar to the configurations and functions of the light source 911 and the modulation driver 914. Configurations and functions of the DSP 50, the digital analog converter 51, and the analog digital converter 52 are similar to the configurations and functions of the DSP 901, the digital analog converter 902, and the analog digital converter 903. Therefore, detailed description of the configurations and functions of the light source 10, the modulation driver 12, the DSP 50, the digital analog converter 51, and the analog digital converter 52 is omitted.

The polarization maintaining coupler (PMC) 11 splits coherent light emitted from the light source 10 into two light beams at a predetermined ratio, for example, at a ratio of 100:1. The light source 10 supplies one of the two light beams that has a proportion of 100 to the optical modulator 13 and supplies the other one of the two light beams that has a proportion of 1 to the optical waveguide substrate 100 as local light.

Figure 4:
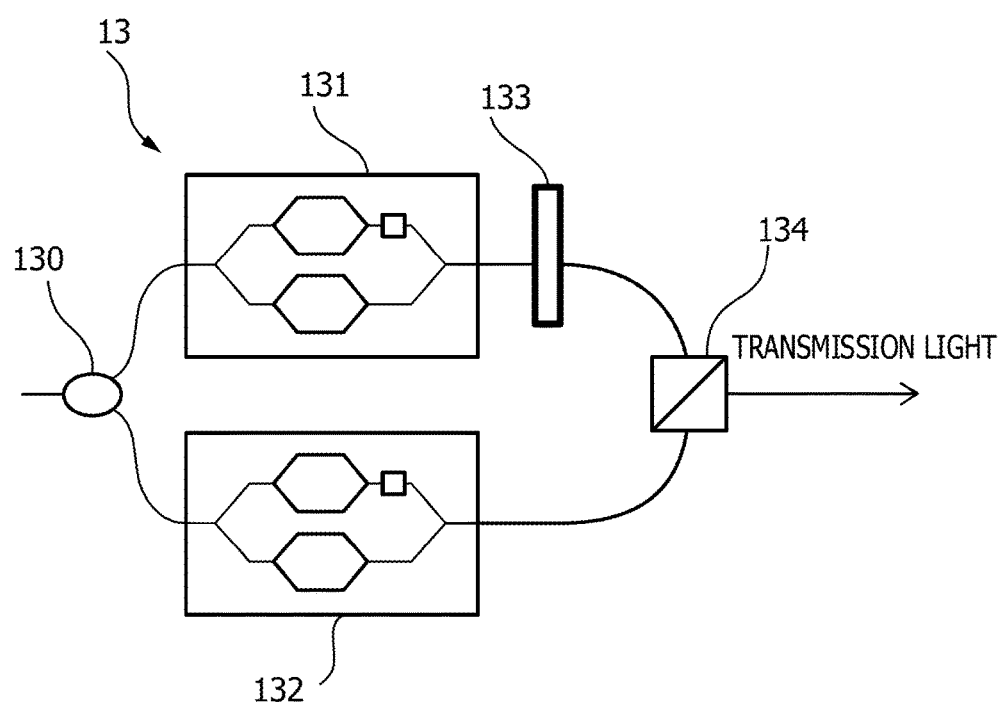
FIG. 4 is an internal block diagram of the optical modulator illustrated in FIG. 3.

FIG. 4 is an internal block diagram of the optical modulator 13.

The optical modulator 13 is an optical waveguide substrate that includes a beam splitter 130, a first QPSK circuit 131, a second QPSK circuit 132, a polarization rotator 133, and a polarization beam combiner (PBC) 134. The beam splitter 130 splits light supplied from the beam splitter 913 at a ratio of 1:1 and supplies the split light beams to the first QPSK circuit 131 and the second QPSK circuit 132, respectively. The first QPSK circuit 131 and the second QPSK circuit 132 each perform quadrature phase shift keying on the light supplied from the beam splitter 130. The first QPSK circuit 131 supplies the light that has been subjected to quadrature phase shift keying to the polarization rotator 133, and the second QPSK circuit 132 supplies the light that has been subjected to quadrature phase shift keying to the PBC 134. The polarization rotator 133 polarizes the light supplied from the first QPSK circuit 131 by 90 degrees and supplies the polarized light to the PBC 134. The PBC 134 multiplexes the light supplied from the second QPSK circuit 132 and the light supplied from the polarization rotator 133 and supplies the multiplexed light to a DFA 116. Structures and functions of the beam splitter 130, the first QPSK circuit 131, the second QPSK circuit 132, the polarization rotator 133, and the PBC 134 are widely known, and therefore detailed description thereof is omitted.

The excitation laser 20 is, for example, a distributed feedback laser, an SG-DBR laser, or a ring resonator laser. The excitation laser 20 generates excitation light for exciting an erbium ion ($Er^{+3}$) in a 0.98 μm band or in a 1.48 μm band and supplies the generated excitation light to the optical waveguide substrate 100. The excitation light generated by the excitation laser 20 is, for example, set so that a P-wave component and an S-wave component each are 50%. In one example, the excitation light is introduced into a fiber twisted by 45 degrees, and thus a P-wave component and an S-wave component each are set to 50%. In another example, the excitation light is introduced into a ½ wave plate, and thus a P-wave component and an S-wave component each are set to 50%. The excitation laser 20, which generates heat, is preferably disposed outside the optical waveguide substrate 100.

The optical waveguide substrate 100 is a planar waveguide that is an optical waveguide substrate on which a plurality of optical elements are provided. The optical waveguide substrate 100 includes a first transmission waveguide 14, a second transmission waveguide 15, a third transmission waveguide 16, a first excitation waveguide 21, and a second excitation waveguide 22. The optical waveguide substrate 100 further includes an optical signal processor 30 that demodulates reception light modulated, for example, by DP-QPSK and an OE converter 40 that converts an optical signal demodulated by an optical signal processor into an electric signal. The optical waveguide substrate 100 is, for example, a silica-based substrate. In another example, the optical waveguide substrate 100 is a silicon photonics substrate that can be produced in a size that is 1/50 of a size of a silica-based substrate.

The first transmission waveguide 14, the second transmission waveguide 15, and the third transmission waveguide 16 are connected to each other. Transmission light introduced into the first transmission waveguide 14 is amplified by the second transmission waveguide 15 and is then emitted from the third transmission waveguide 16. The first excitation waveguide 21 is an optical waveguide that introduces the excitation light emitted from the excitation laser 20 into the optical signal processor 30. The second excitation waveguide 22 is an optical waveguide that introduces the excitation light emitted from the excitation laser 20 into the second transmission waveguide 15. Structures of the first transmission waveguide 14 and the third transmission waveguide 16 and structures of the first excitation waveguide 21 and the second excitation waveguide 22 are well known, and therefore detailed description thereof is omitted.

Figure 5A:
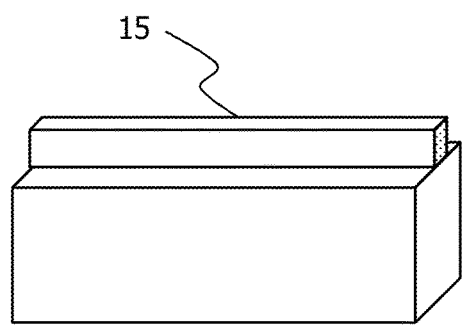
FIG. 5A is a perspective view of an example of a second transmission waveguide illustrated in FIG. 3.
Figure 5B:
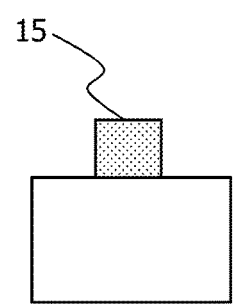
FIG. 5B is a front view of the second transmission waveguide illustrated in FIG. 5A.
Figure 5C:
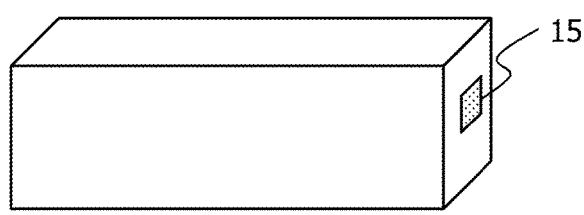
FIG. 5C is a perspective view of another example of the second transmission waveguide illustrated in FIG. 3.
Figure 5D:
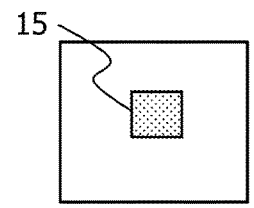
FIG. 5D is a front view of the second transmission waveguide illustrated in FIG. 5C.

FIG. 5A is a perspective view illustrating an example of the second transmission waveguide 15. FIG. 5B is a front view of the second transmission waveguide 15 illustrated in FIG. 5A. FIG. 5C is a perspective view illustrating another example of the second transmission waveguide 15. FIG. 5D is a front view of the second transmission waveguide 15 illustrated in FIG. 5C.

The second transmission waveguide 15 is a waveguide-type EDFA doped with an erbium ion ($Er^{+3}$) and is also called an EDWA. The second transmission waveguide 15 may be a ridge type as illustrated in FIGS. 5A and 5B or may be an embedded type as illustrated in FIGS. 5C and 5D. A relative refractive index difference of the second transmission waveguide 15 is approximately 0.5% to 1% in a case where the optical waveguide substrate 100 is a silica-based substrate and is approximately 35% in a case where the optical waveguide substrate 100 is a silicon photonics substrate.

In a case where the second transmission waveguide 15 is the ridge type, the second transmission waveguide 15 can be increased in size and can be easily designed. Meanwhile, in a case where the second transmission waveguide 15 is the embedded type, the size of the second transmission waveguide 15 is small. A mode field radius of the second transmission waveguide 15 is, for example, 5 μm. A mode field radius of a conventional waveguide is approximately 10 μm. That is, the mode field radius of the second transmission waveguide 15 is substantially half of the mode field radius of a conventional waveguide. The mode field radius of second transmission waveguide 15 is desirably approximately half of a conventional waveguide so that not only reception light, but also excitation light having a wavelength shorter than the reception light are guided. The second transmission waveguide 15 may be doped with an erbium ion ($Er^{+3}$) during crystal growth or may be doped with an erbium ion ($Er^{+3}$) after crystal growth.

Into the second transmission waveguide 15, excitation light is introduced from a direction identical to a direction from which transmission light is introduced from the optical modulator 13 through the first transmission waveguide 14. Since excitation light is introduced into the second transmission waveguide 15 from a direction identical to a direction from which transmission light is introduced, noise figure (NF) of the second transmission waveguide 15 becomes low.

The optical signal processor 30 includes a polarization beam splitter 31, a beam splitter 32, and a first optical hybrid circuit 33 and a second optical hybrid circuit 34 that are a pair of optical 90-degree hybrid circuits. The optical signal processor 30 further includes a first reception light waveguide 35, a second reception light waveguide 36, a first local light waveguide 37, and a second local light waveguide 38. Configurations and functions of the polarization beam splitter 31, the first optical hybrid circuit 33, and the second optical hybrid circuit 34 are similar to configurations and functions of the polarization beam splitter 941, the first optical hybrid circuit 943, and the second optical hybrid circuit 944. Therefore, detailed description of the configurations and functions of the first optical hybrid circuit 33 and the second optical hybrid circuit 34 is omitted. The first reception light waveguide 35 is an optical waveguide that connects the polarization beam splitter 31 and the first optical hybrid circuit 33, and the second reception light waveguide 36 is an optical waveguide that connects the polarization beam splitter 31 and the second optical hybrid circuit 34.

Local light is introduced in one input port of the beam splitter 32, and excitation light is introduced into the other input port of the beam splitter 32 through the first excitation waveguide 21. The first local light waveguide 37 is an optical waveguide that connects the beam splitter 32 and the first optical hybrid circuit 33, and the second local light waveguide 38 is an optical waveguide that connects the beam splitter 32 and the second optical hybrid circuit 34. The first local light waveguide 37 and the second local light waveguide 38 each are a waveguide-type EDFA doped with an erbium ion ($Er^{+3}$), as in the case of the second transmission waveguide 15.

Figure 6A:
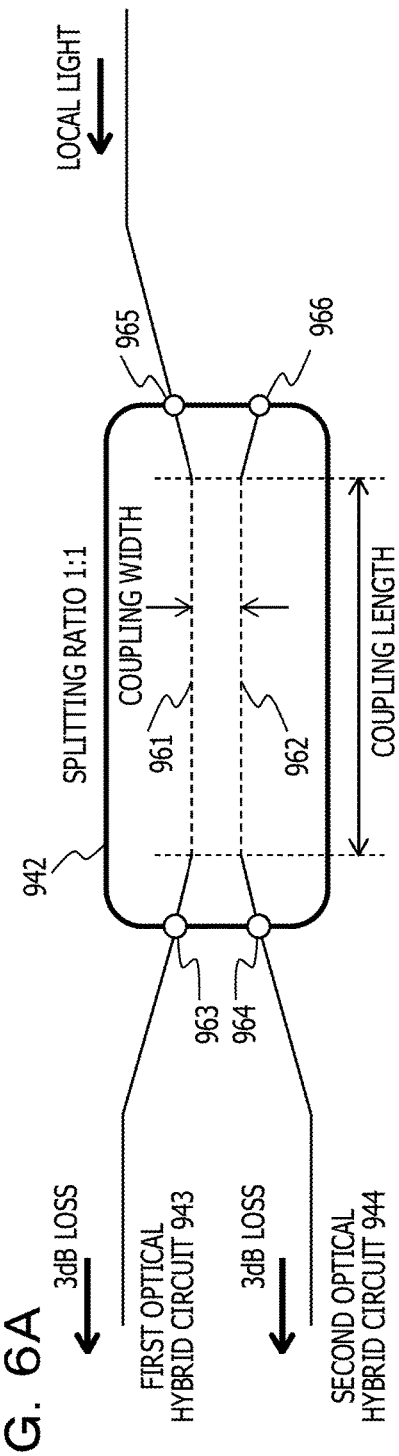
FIG. 6A is a view for explaining operation of a beam splitter illustrated in FIG. 1A.
Figure 6B:
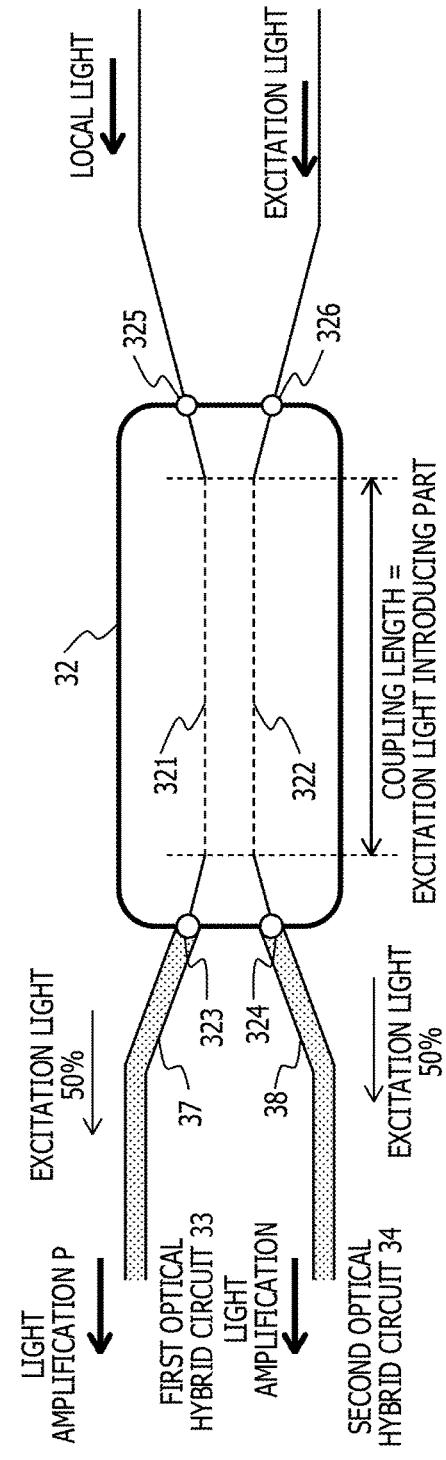
FIG. 6B is a view for explaining operation of a beam splitter illustrated in FIG. 3.

FIG. 6A is a view for explaining operation of the beam splitter 942, and FIG. 6B is a view for explaining operation of the beam splitter 32.

The beam splitter 942 includes a first waveguide 961, a second waveguide 962, a first port 963, a second port 964, a third port 965, and a fourth port 966. The first port 963 is disposed at one end of the first waveguide 961. The second port 964 is disposed at one end of the second waveguide 962. The third port 965 is disposed at the other end of the first waveguide 961. The fourth port 966 is disposed at the other end of the second waveguide 962. A splitting ratio of the beam splitter 942 is, for example, 1:1. The beam splitter 942 receives local light from the third port 965, attenuates the received local light by 3 dB, and then supplies the attenuated local light to the first optical hybrid circuit 943 and the second optical hybrid circuit 944 through the first port 963 and the second port 964.

The beam splitter 32 includes a first waveguide 321, a second waveguide 322, a first port 323, a second port 324, a third port 325, and a fourth port 326. The first port 323 is disposed at one end of the first local light waveguide 37. The second port 324 is disposed at one end of the second local light waveguide 38. The third port 325 is disposed at the other end of the first waveguide 321. The fourth port 326 is disposed at the other end of the second waveguide 322. A splitting ratio of the beam splitter 32 is, for example, 1:1.

The beam splitter 32 receives local light from the third port 325 and receives excitation light from the fourth port 326. The beam splitter 32 combines the received local light and excitation light. Then, the beam splitter 32 splits the combined light into halves and supplies the split light beams to the first local light waveguide 37 and the second local light waveguide 38 through the first port 323 and the second port 324. The first local light waveguide 37 and the second local light waveguide 38 amplify received light and supply the amplified light to the first optical hybrid circuit 33 and the second optical hybrid circuit 34.

The OE converter 40 includes four pairs of photo diodes 41 and four trans impedance amplifiers 42. A configuration and a function of the OE converter 40 are similar to the configuration and function of the OE converter 932, and therefore detailed description thereof is omitted.

Effect of Optical Module According to First Embodiment

The optical module according to the first embodiment amplifies local light and transmission light since a pair of local light waveguides and a transmission light waveguide that are doped with a rare-earth ion that amplifies light having a predetermined frequency upon introduction of excitation light are provided on a waveguide substrate. The optical module according to the first embodiment can be made small in size and can obtain good light amplification characteristics since local light and transmission light are amplified by using a pair of local light waveguides and a transmission light waveguide provided on a waveguide substrate.

Configuration and Function of Optical Module According to Second Embodiment

Figure 7:
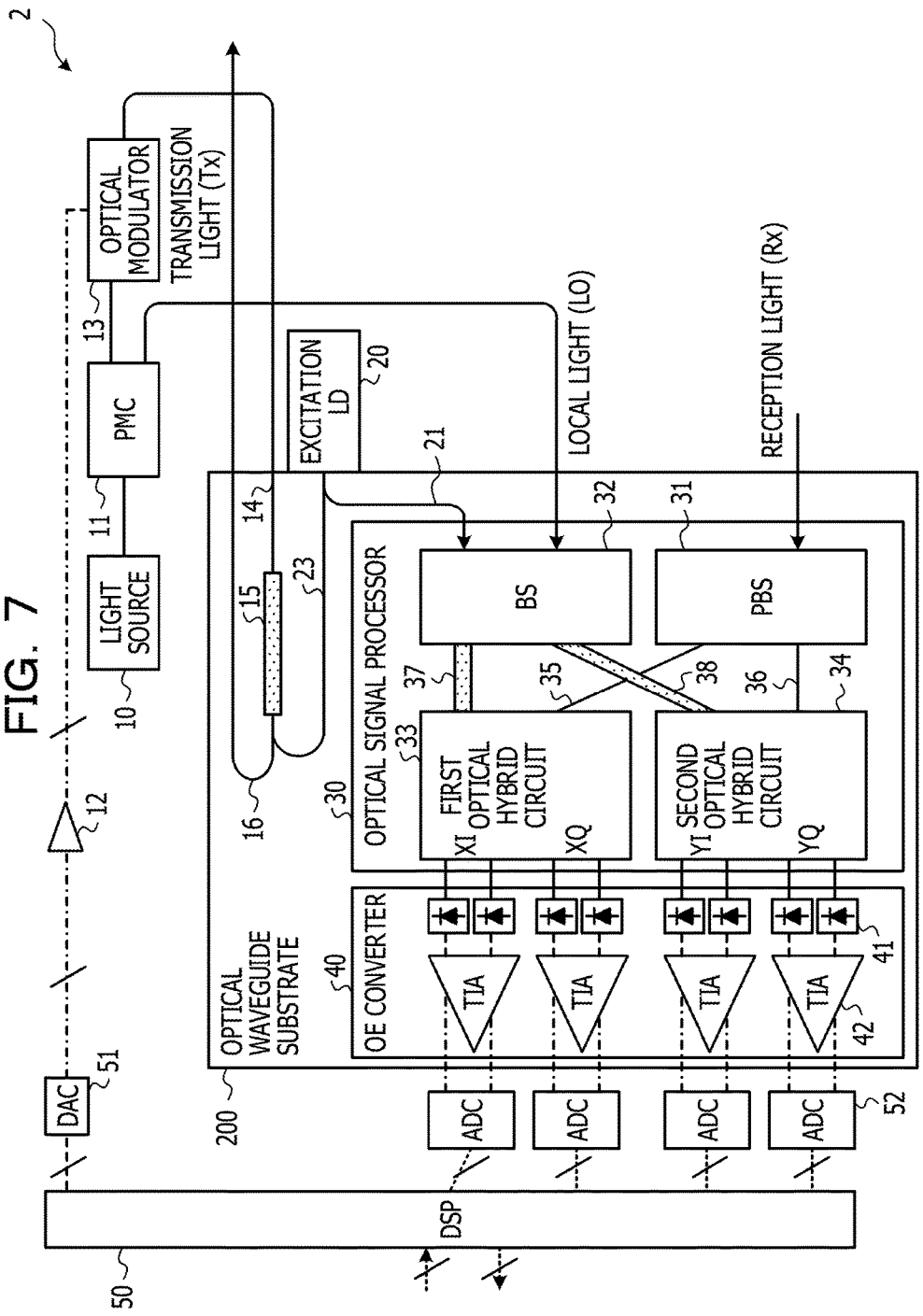
FIG. 7 is a block diagram of a module according to a second embodiment.

FIG. 7 is a block diagram of an optical module according to a second embodiment. In FIG. 7, an optical signal is indicated by the solid light, and an electric signal is indicated by a line with alternate long and short dashes.

An optical module 2 is different from the optical module 1 in that the optical module 2 includes an optical waveguide substrate 200 instead of the optical waveguide substrate 100. Configurations and functions of constituent elements of the optical module 2 other than the optical waveguide substrate 200 are identical to the configurations and functions of the constituent elements of the optical module 1 given identical reference signs, and therefore detailed description thereof is omitted.

The optical waveguide substrate 200 is different from the optical waveguide substrate 100 in that a second excitation waveguide 23 is provided instead of the second excitation waveguide 22. The second excitation waveguide 23 is provided so that excitation light is introduced from a direction opposite to a direction from which transmission light is introduced from an optical modulator 13 through a first transmission waveguide 14. That is, the second excitation waveguide 23 is connected to a surface opposite to a surface of a second transmission waveguide 15 to which a first transmission waveguide 14 is connected.

Effect of Optical Module According to Second Embodiment

The optical module according to the second embodiment can have a higher amplification rate than the optical module according to the first embodiment since excitation light is introduced from a direction opposite to a direction from which transmission light is introduced.

Configuration and Function of Optical Module According to Third Embodiment

Figure 8:
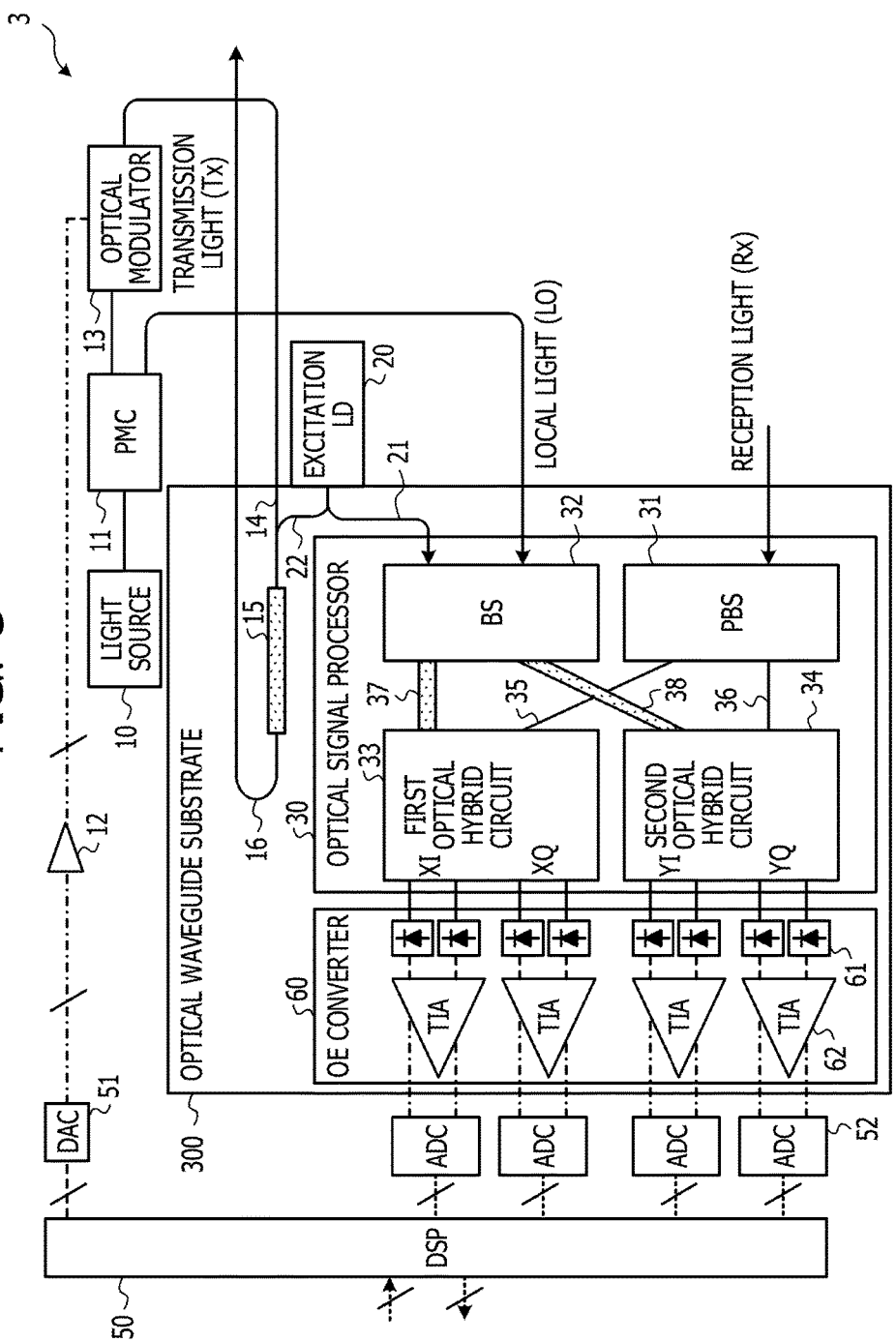
FIG. 8 is a block diagram of a module according to a third embodiment.

FIG. 8 is a block diagram of an optical module according to a third embodiment. In FIG. 8, an optical signal is indicated by the solid light, and an electric signal is indicated by a line with alternate long and short dashes.

An optical module 3 is different from the optical module 1 in that the optical module 3 includes an optical waveguide substrate 300 instead of the optical waveguide substrate 100. The optical module 3 is different from the optical module 1 in that the optical module 3 includes an OE converter 60 instead of the OE converter 40. Configurations and functions of constituent elements of the optical module 3 other than the optical waveguide substrate 300 and the OE converter 60 are identical to the configurations and functions of the constituent elements of the optical module 1 given identical reference signs, and therefore detailed description thereof is omitted.

The optical waveguide substrate 300 is different from the optical waveguide substrate 100 in that the OE converter 40 is not disposed. Configurations and functions of constituent elements of the optical waveguide substrate 300 are identical to the configurations and functions of the constituent elements of the optical waveguide substrate 100 given identical reference signs, and therefore detailed description thereof is omitted.

The OE converter 60 has four pairs of photo diodes 61 and four trans impedance amplifiers 62. A configuration and a function of the OE converter 60 are similar to the configuration and function of the OE converter 40 except for that the OE converter 60 is not disposed on an optical waveguide substrate, and therefore detailed description thereof is omitted.

Configuration and Function of Optical Module According to Fourth Embodiment

Figure 9:
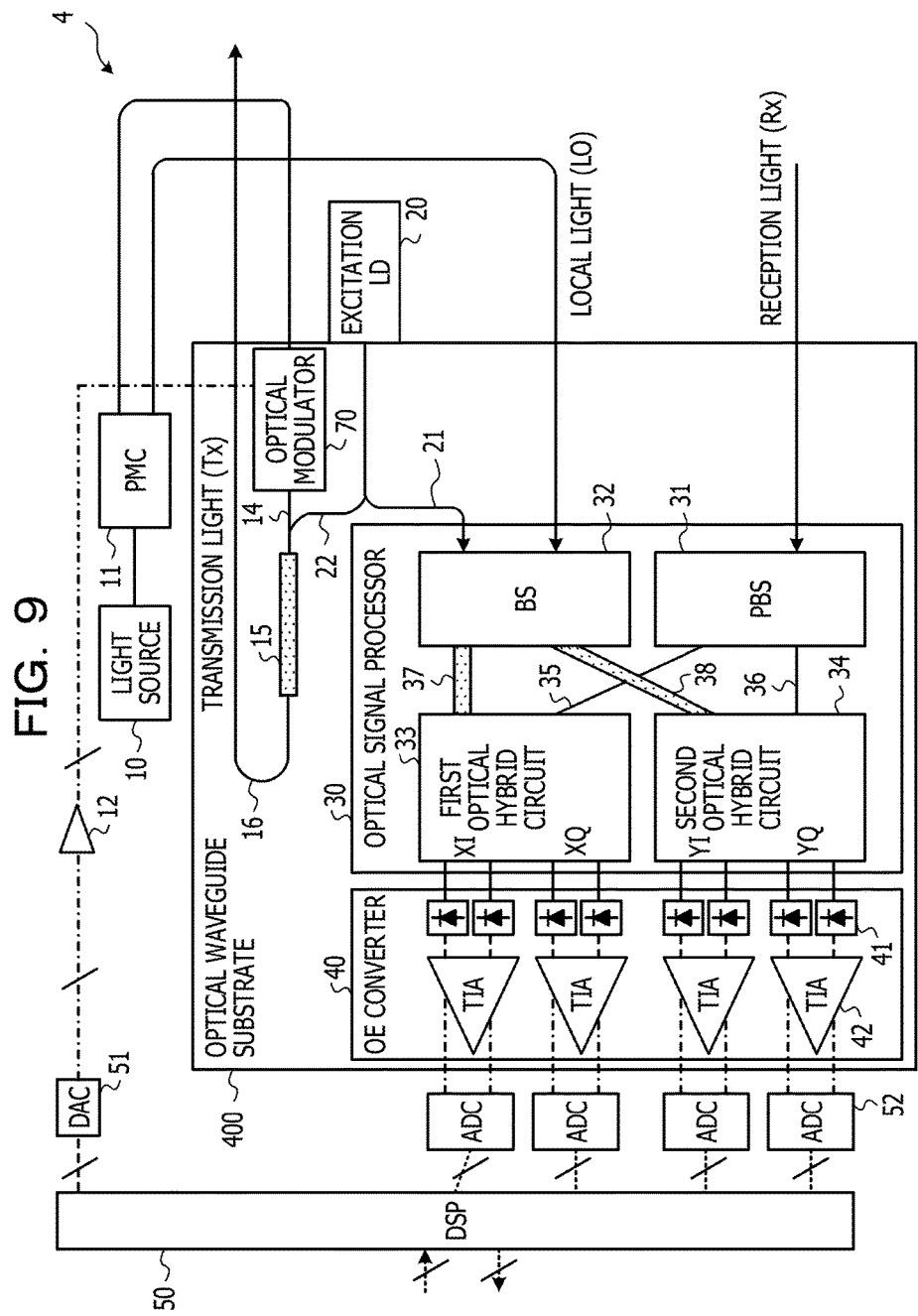
FIG. 9 is a block diagram of a module according to a fourth embodiment.

FIG. 9 is a block diagram of an optical module according to a fourth embodiment. In FIG. 9, an optical signal is indicated by the solid light, and an electric signal is indicated by a line with alternate long and short dashes.

An optical module 4 is different from the optical module 1 in that the optical module 4 includes an optical waveguide substrate 400 instead of the optical waveguide substrate 100. The optical module 4 is different from the optical module 1 in that the optical module 4 includes an optical modulator 70 instead of the optical modulator 13. Configurations and functions of constituent elements of the optical module 4 other than the optical waveguide substrate 400 and the optical modulator 70 are identical to the configurations and functions of the constituent elements of the optical module 1 given identical reference signs, and therefore detailed description thereof is omitted.

The optical waveguide substrate 400 is different from the optical waveguide substrate 100 in that the optical modulator 70 is mounted. Configurations and functions of constituent elements of the optical waveguide substrate 400 except for that the optical modulator 70 is mounted are identical to the configurations and functions of the constituent elements of the optical waveguide substrate 100 given identical reference signs, and therefore detailed description thereof is omitted. The optical modulator 70 have a configuration and a function similar to a configuration and a function of the optical modulator 13 except for that the optical modulator 70 is provided on the optical waveguide substrate 400.

Effects of Optical Module According to Fourth Embodiment

The optical module according to the fourth embodiment can be further reduced in size since an optical modulator is provided on an optical waveguide substrate.

Configuration and Function of Optical Module According to Fifth Embodiment

Figure 10:
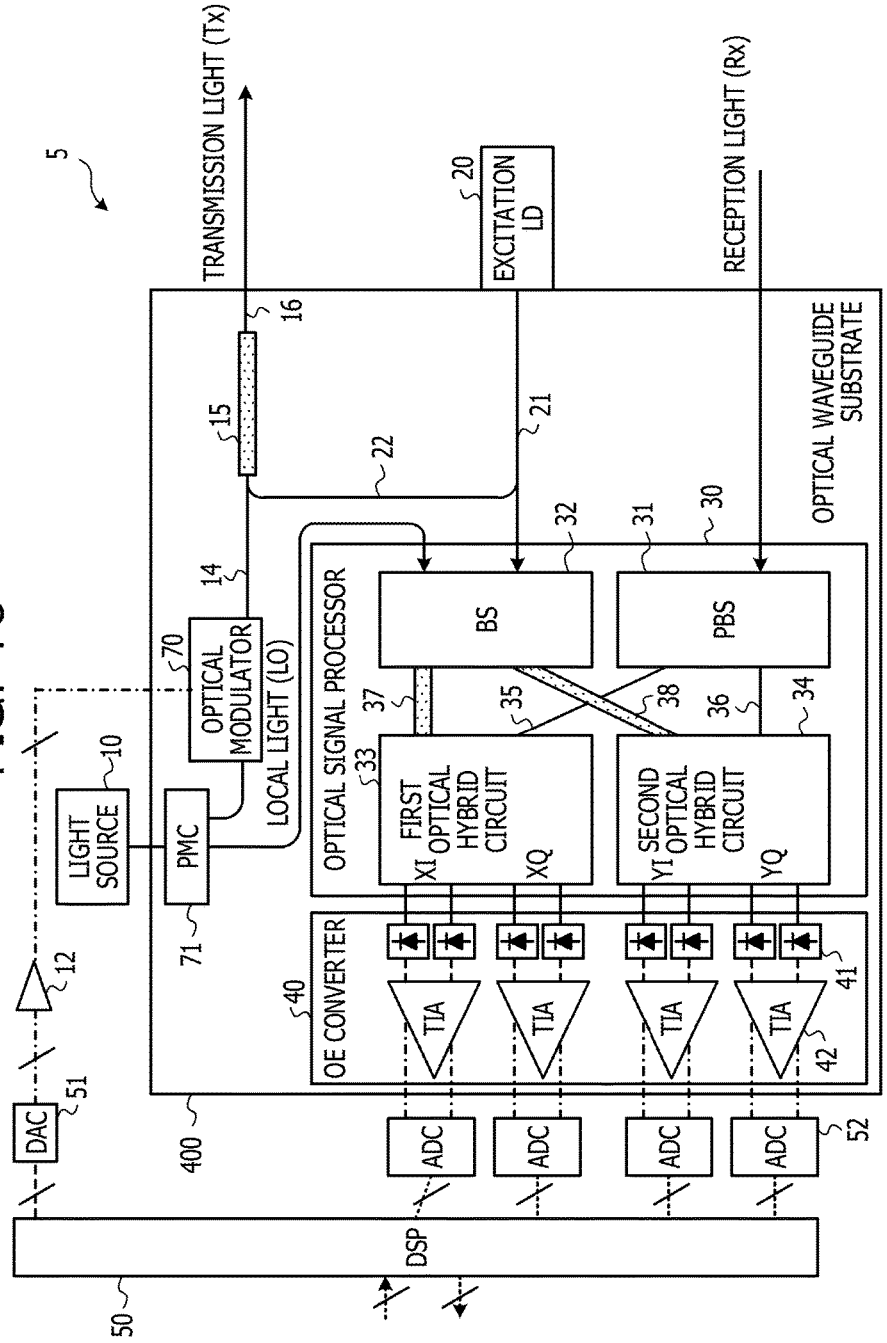
FIG. 10 is a block diagram of a module according to a fifth embodiment.

FIG. 10 is a block diagram of an optical module according to a fifth embodiment. In FIG. 10, an optical signal is indicated by the solid light, and an electric signal is indicated by a line with alternate long and short dashes.

An optical module 5 is different from the optical module 4 in that the optical module 5 includes an optical waveguide substrate 500 instead of the optical waveguide substrate 400. The optical module 5 is different from the optical module 4 in that the optical module 5 includes a PMC 71 instead of the PMC 11. Configurations and functions of constituent elements of the optical module 5 other than the optical waveguide substrate 500 and the PMC 71 are identical to the configurations and functions of the constituent elements of the optical module 4 given identical reference signs, and therefore detailed description thereof is omitted.

The optical waveguide substrate 500 is different from the optical waveguide substrate 400 in that the PMC 71 is mounted. Configurations and functions of constituent elements of the optical waveguide substrate 500 other than the PMC 71 are identical to the configurations and functions of the constituent elements of the optical waveguide substrate 400 given identical reference signs, and therefore detailed description thereof is omitted. The PMC 71 has a configuration and a function similar to the configuration and function of the PMC 11 except for that the PMC 71 is provided on the optical waveguide substrate 500.

Effects of Optical Module According to Fifth Embodiment

The optical module according to the fifth embodiment can be further reduced in size since an optical modulator and a PMC are provided on an optical waveguide substrate.

Configuration and Function of Optical Module According to Sixth Embodiment

Figure 11:
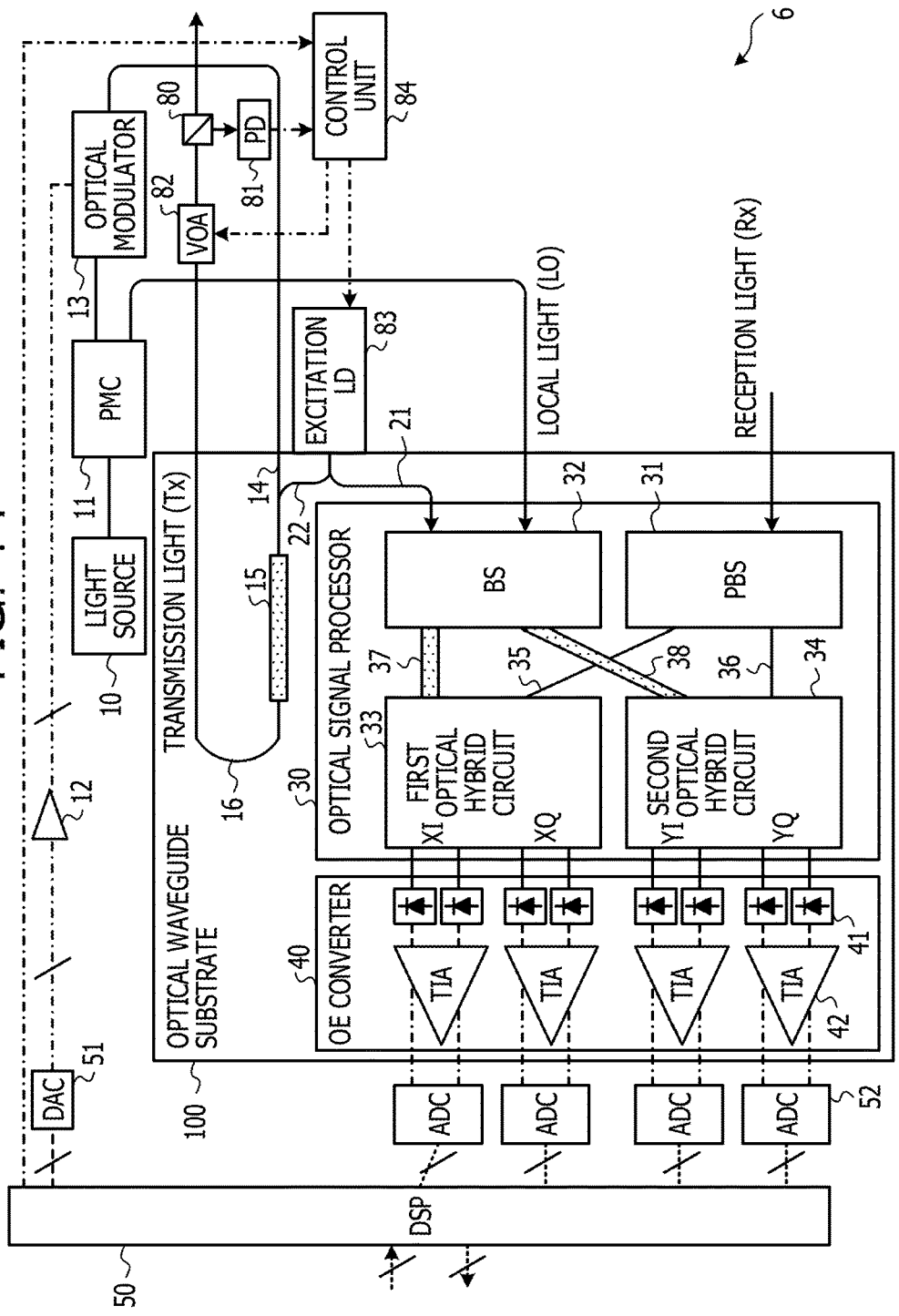
FIG. 11 is a block diagram of a module according to a sixth embodiment.

FIG. 11 is a block diagram of an optical module according to a sixth embodiment. In FIG. 11, an optical signal is indicated by the solid light, and an electric signal is indicated by a line with alternate long and short dashes.

An optical module 6 is different from the optical module 1 in that the optical module 6 includes a demultiplexer 80, a photo detector 81, a variable optical attenuator (VOA) 82, and a control unit 84. The optical module 6 is different from the optical module 1 in that the optical module 6 includes an excitation laser 83 instead of the excitation laser 20. Configurations and functions of constituent elements of the optical module 6 other than the demultiplexer 80, the photo detector 81, the VOA 82, the excitation laser 83, and the control unit 84 are identical to the configurations and functions of the constituent elements of the optical module 1 given identical reference signs, and therefore detailed description thereof is omitted.

The demultiplexer 80 is, for example, a pair of prisms whose inclined surfaces are joined to each other. The demultiplexer 80 splits transmission light emitted from the optical waveguide substrate 100 into two light beams, for example, at a ratio of 100:1 and supplies one of the two light beams that has a lower split proportion to the photo detector 81. The photo detector 81 is, for example, a photo diode. The photo detector 81 supplies an electric current corresponding to output power of light entering from the demultiplexer 80 to the control unit 84 as a transmission light output power signal indicative of the output power of the transmission light.

The VOA 82 increases or decreases light output power of transmission light emitted from the optical waveguide substrate 100 in accordance with a transmission light control signal supplied from the control unit 84. The excitation laser 83 has a configuration similar to the configuration of the excitation laser 20 and increases or decreases light output power of output light in accordance with an electric current that corresponds to an excitation light control signal supplied from the control unit 84.

Figure 12A:
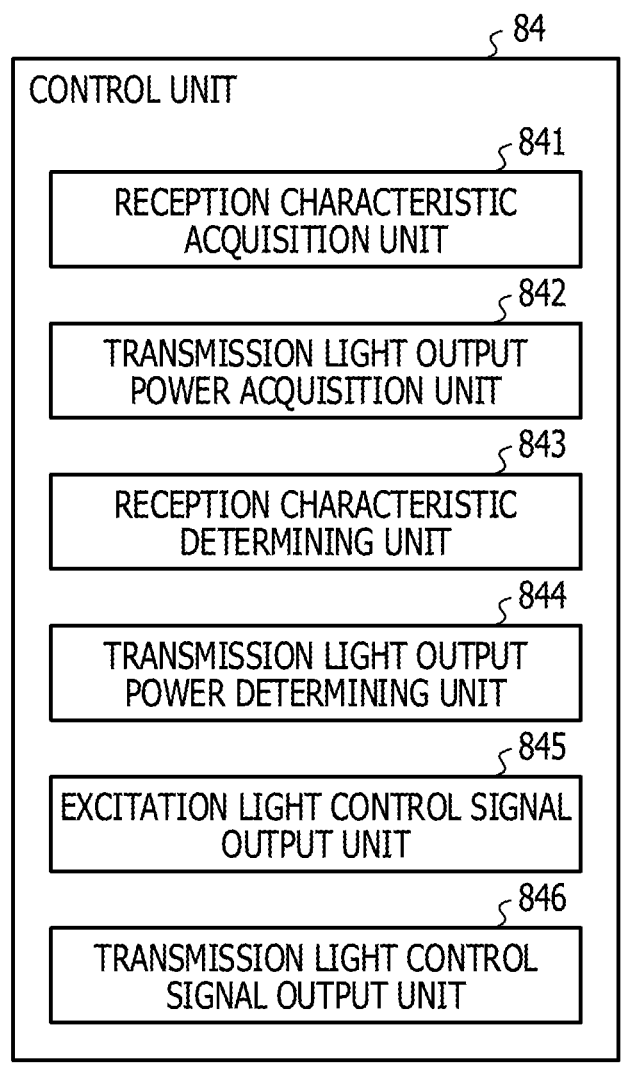
FIG. 12A is a functional block diagram of a control unit illustrated in FIG. 11.
Figure 12B:
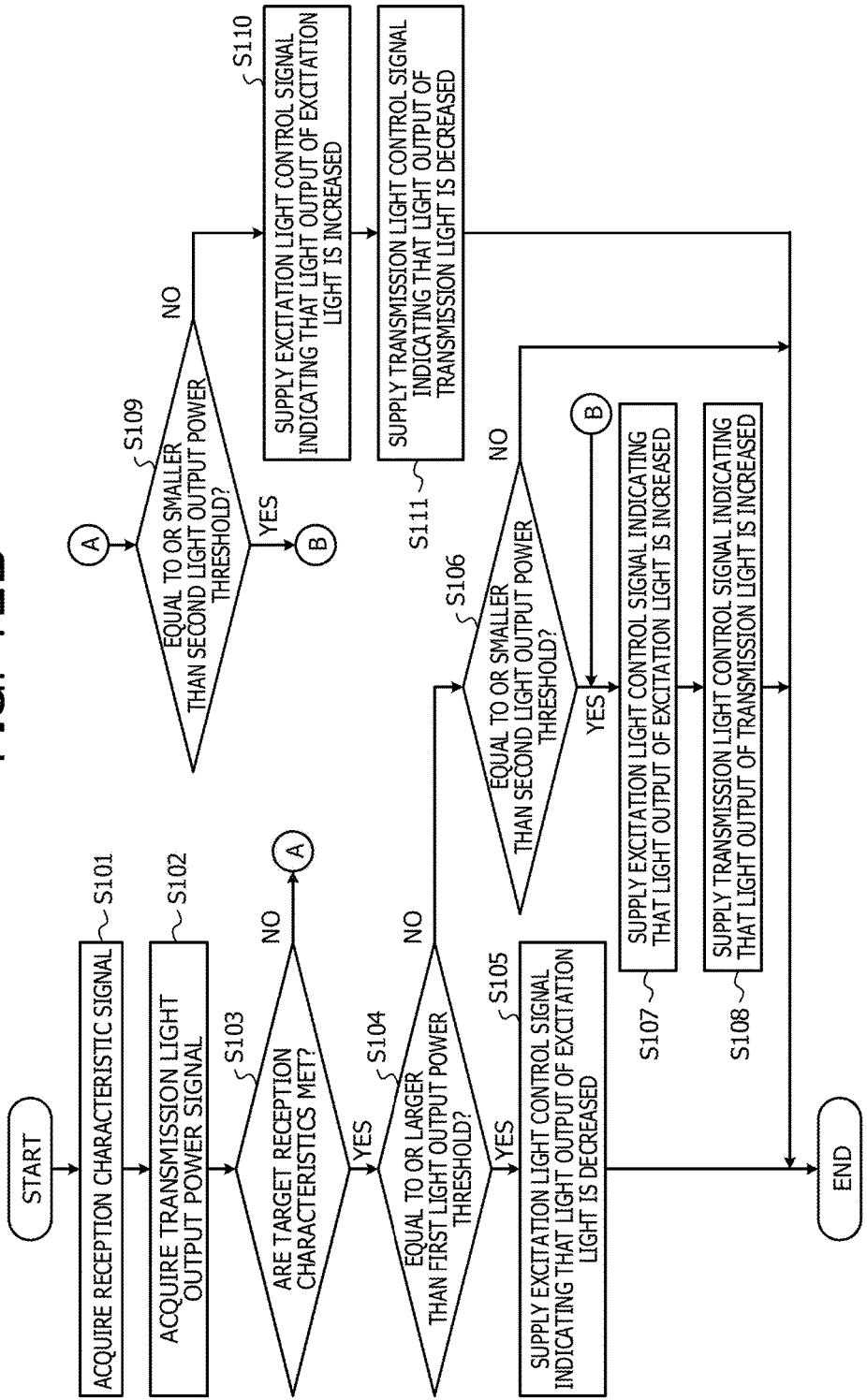
FIG. 12B is a flowchart of a transmission light output power control process performed by a control unit illustrated in FIG. 12A.

FIG. 12A is a functional block diagram illustrating the control unit 84. FIG. 12B is a flowchart of a transmission light output power control process performed by the control unit 84.

The control unit 84 is constituted, for example, by a logical circuit constituted by a CMOS transistor provided on a silicon substrate and a storage circuit constituted by a flash memory or the like. The control unit 84 includes a reception characteristic acquisition unit 841, a transmission light output power acquisition unit 842, a reception characteristic determining unit 843, a transmission light output power determining unit 844, an excitation light control signal output unit 845, and a transmission light control signal output unit 846.

First, the reception characteristic acquisition unit 841 acquires, from a DSP 50, a reception characteristic signal indicative of reception characteristics of reception light (S101). For example, the reception characteristics may be an error rate of a signal corresponding to the reception light or may be an error count of a signal corresponding to the reception light. Next, the transmission light output power acquisition unit 842 acquires a transmission light output power signal from the photo detector 81 (S102).

Next, the reception characteristic determining unit 843 determines whether or not reception characteristics corresponding to the reception characteristic signal acquired in the process in S101 meet target reception characteristics to be aimed at (S103). In a case where it is determined that the reception characteristics meet the target reception characteristics (YES in S103), the transmission light output power determining unit 844 determines whether or not light output power of transmission light is equal to or larger than a predetermined first light output power threshold value (S104). The light output power of the transmission light is light output power that corresponds to the transmission light output power signal supplied from the photo detector 81.

In a case where it is determined that the light output power is equal to or larger than the first light output power threshold value (YES in S104), the excitation light control signal output unit 845 supplies, to the excitation laser 83, an excitation light control signal indicating that light output power of the excitation laser 83 is decreased (S105). The excitation light control signal indicating that the light output power of the excitation laser 83 is decreased is, for example, a signal indicating that an electric current to be supplied to the excitation laser 83 is decreased. The excitation laser 83 decreases the light output power of the excitation laser 83 upon receipt of the excitation light control signal.

In a case where it is determined that the light output power is less than the first light output power threshold value (NO in S104), the transmission light output power determining unit 844 determines whether or not the light output power corresponding to the transmission light output power signal is equal to or smaller than a predetermined second light output power threshold value (S106). The second light output power threshold value is smaller than the first light output power threshold value. Light output power between the first light output power threshold value and the second light output power threshold value is a range of light output power of transmission light to be aimed at.

In a case where it is determined that the output power is equal to or lower than the second light output power threshold value (YES in S106), the excitation light control signal output unit 845 supplies, to the excitation laser 83, an excitation light control signal indicating that the light output power of the excitation laser 83 is increased (S107). The excitation light control signal indicating that the light output power of the excitation laser 83 is increased is, for example, a signal indicating that an electric current to be supplied to the excitation laser 83 is increased. The excitation laser 83 increases the light output power of the excitation laser 83 upon receipt of the excitation light control signal. The increase in light output power of the excitation laser 83 increases an amplification rate of the transmission light in the second transmission waveguide 15, thereby increasing the light output power of the transmission light.

Next, the transmission light control signal output unit 846 supplies, to the VOA 82, a transmission light control signal indicating that the light output power of the transmission light is increased (S108). Upon receipt of the transmission light control signal, the VOA 82 decreases an amount of attenuation of the transmission light and thereby increases the light output power of the transmission light. Since the VOA 82 decreases an amount of attenuation of the transmission light, the light output power of the transmission light is further increased.

In a case where it is determined that the output power is larger than the second light output power threshold value (NO in S106), the excitation light control signal output unit 845 does not output the excitation light control signal. The excitation light control signal is not output in a case where the output power is in the target range of less than the first light output power threshold value and larger than the second light output power threshold value. Accordingly, the excitation laser 83 maintains the light output power.

In a case where it is determined that the reception characteristics do not meet the target reception characteristics (NO in S103), the transmission light output power determining unit 844 determines whether or not the light output power of the transmission light is equal to or smaller than the second light output power threshold value (S109).

In a case where it is determined that the output power is equal to or smaller than the second light output power threshold value (YES in S109), the excitation light control signal output unit 845 supplies, to the excitation laser 83, an excitation light control signal indicating that the light output power of the excitation laser 83 is increased (S107). Next, the transmission light control signal output unit 846 supplies, to the VOA 82, a transmission light control signal indicating that the light output power of the transmission light is increased (S108).

In a case where it is determined that the output power is larger than the second light output power threshold value (NO in S109), the excitation light control signal output unit 845 supplies, to the excitation laser 83, an excitation light control signal indicating that the light output power of the excitation laser 83 is increased (5110). The increase in light output power of the excitation laser 83 increases an amplification rate of local light in the first local light waveguide 37 and the second local light waveguide 38, thereby increasing light output power of the local light. The increase in light output power of the excitation laser 83 increases an amplification rate of the transmission light in the second transmission waveguide 15, thereby increasing the light output power of the transmission light.

Next, the transmission light control signal output unit 846 supplies, to the VOA 82, a transmission light control signal indicating that the light output power of the transmission light is decreased (S111). Upon receipt of the transmission light control signal, the VOA 82 increases an amount of attenuation of the transmission light and thereby decreases the light output power of the transmission light. Since the VOA 82 decreases the light output power of the transmission light, the light output power of the transmission light increased in the process in 5110 can be decreased.

Effect of Optical Module According to Sixth Embodiment

The optical module according to the sixth embodiment increases light output power of excitation light in a case where it is determined that reception characteristics of reception light do not meet a predetermined condition and it is determined that light output power of transmission light is larger than a predetermined light output power threshold value. In this case, the optical module according to the sixth embodiment decreases the light output power of the transmission light. The optical module according to the sixth embodiment decreases the light output power of the transmission light in order that the light output power of the transmission light does not become too high as a result of an increase in light output power of the excitation light that is for increasing the reception characteristic of the reception light. In a case where light output power of transmission light transmitted through an optical fiber or the like is too high, there is a risk of deterioration of transmission characteristics because of occurrence of distortion of the transmission light. According to the optical module according to the sixth embodiment, the light output power of the transmission light does not become too high since the light output power of the transmission light is decreased in a case where the light output power of the excitation light is increased.

Comparison Between Optical Module According to Embodiments and Other Techniques

Table 1 illustrates a comparison between the optical module according to the embodiments and other techniques. In Table 1, "EDFA" indicates characteristics exhibited when light is amplified by an EDFA, "SOA" indicates characteristics exhibited when light is amplified by an SOA, and "EDWA" indicates characteristics of the optical module according to the embodiments.

TABLE 1

|  | EDFA | SOA | EDWA |
| --- | --- | --- | --- |
| Optical gain | very good | very good | very good |
| NF characteristics | very good | fair | very good |
| Efficiency | very good | good | very good |
| Size | poor | very good | good |
| Application position Flexibility | very good | poor | very good |

In a case where light is amplified by an EDFA, optical gain, NF characteristics, efficiency, and flexibility are very good. However, an EDFA, which has an optical fiber having a length of several meters, has a problem that a size becomes large. In a case where light is amplified by an SOA, optical gain is very good, and a size can be made small. However, an SOA has a problem that an SOA is not preferable for amplification of an optical signal modulated by an optical modulator since a waveform deteriorates because of a pattern effect.

The optical module according to the embodiments that amplifies light by using an EDWA is a digital coherent optical receiver that amplifies only a single frequency band and therefore has good optical gain characteristics. Since the optical module according to the embodiments can be set so as to have reception performance for a waveform selected in accordance with transmission light and local light, influence of noise light is small. Since the optical module according to the embodiments has a structure that amplifies plural optical paths without actual insertion loss by using a single excitation light source, excitation efficiency improves. The optical module according to the embodiments, in which local light and excitation light are multiplexed by using excessive ports of a beam splitter, may dispense with a multiplexer such as a WDM coupler. The optical module according to the embodiments has high flexibility since a waveguide-type EDFA doped with an erbium ion ($Er^{+3}$) is integral with a receiver front-end produced by using a waveguide as a digital coherent optical receiver.

Modification of Optical Module According to Embodiments

In the optical modules 1 to 6, a waveguide-type EDFA doped with an erbium ion ($Er^{+3}$) is used. However, in the optical module according to the embodiments, a waveguide-type EDFA doped with a different kind of rare-earth ion such as a praseodymium ion ($Pr^{+3}$) may be used.

In the optical modules 1 to 6, the optical modulator 13 or 70 is used. However, in the optical module according to the embodiments, an optical modulator of a different form may be used.

Figure 13:
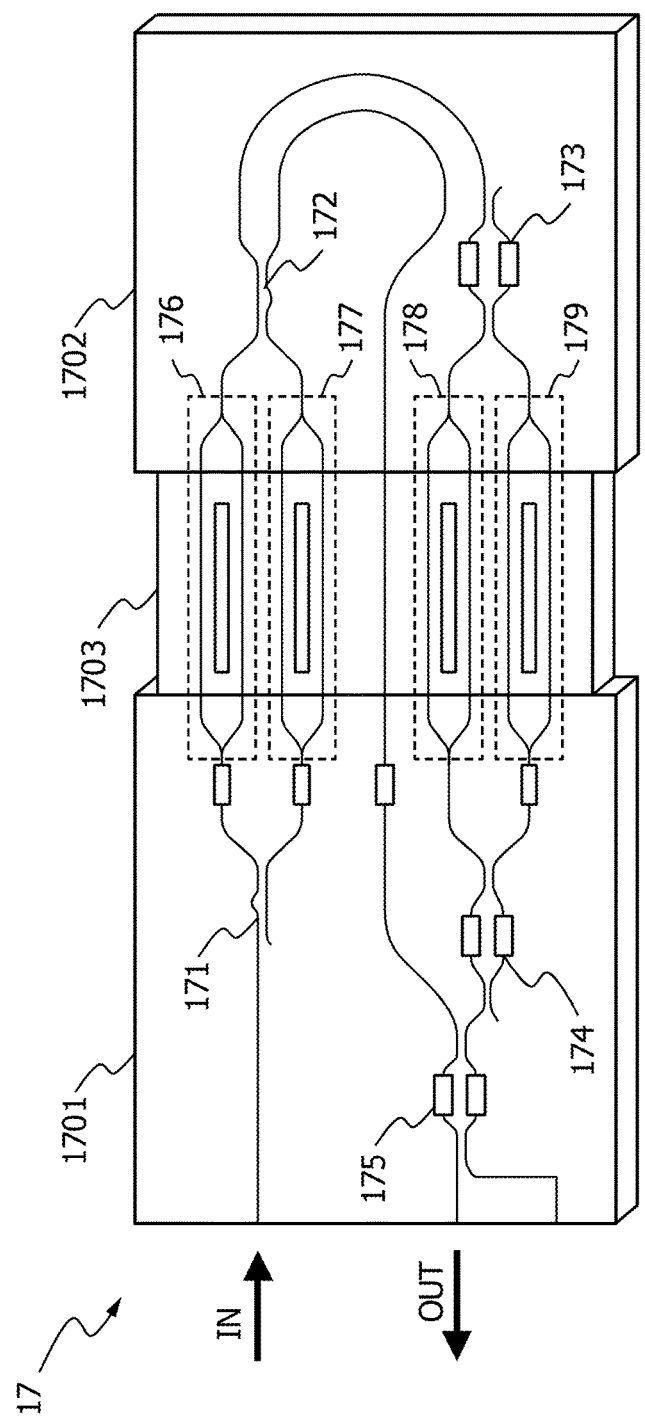
FIG. 13 is an internal block diagram of an optical modulator according to a modification.

FIG. 13 illustrates an internal block diagram of an optical modulator according to a modification.

An optical modulator 17 is a variable multi-level optical modulator that is constituted by a first planar optical circuit 1701, a second planar optical circuit 1702, and an LN element 1703 and includes a first coupler 171, a second coupler 172, a third coupler 173, a fourth coupler 174, and a fifth coupler 175 and a first modulation circuit 176, a second modulation circuit 177, a third modulation circuit 178, and a fourth modulation circuit 179. The first coupler 171, the second coupler 172, and the third coupler 173 each are a 3 dB coupler. The fourth coupler 174 and the fifth coupler 175 each are a variable coupler. The first modulation circuit 176, the second modulation circuit 177, the third modulation circuit 178, and the fourth modulation circuit 179 each are a Mach-Zehnder optical modulator.

In the optical module 6, the VOA 82 and the optical modulator 13 are used to reduce light output power of transmission light. Meanwhile, in the optical module according to the embodiments, light output power of transmission light may be reduced by using a VOA mounted on an optical modulator. An optical modulator provided with a VOA is described, for example, in "Multilevel Optical Modulator Utilizing PLC-LiNbO3 Hybrid-integration Technology" (Mino et al., *NTT Technical Review*, 2011 Vol. 23 No. 3, March 2011). The optical module according to the embodiments can be further reduced in size by reducing light output power of transmission light by using a VOA mounted on an optical modulator.

In the optical modules 1 to 6, an excitation laser is disposed outside an optical waveguide substrate. Meanwhile, in an optical module according to the embodiments, an excitation laser may be mounted on an optical waveguide substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
    a light source;
    a demultiplexer configured to demultiplex a light emitted from the light source into a transmission light and a local light;
    an optical modulator configured to modulate the transmission light;
    an optical waveguide substrate configured to receive the transmission light modulated by the optical modulator, the local light, and a reception light;
    an excitation light source configured to introduce excitation light into the optical waveguide substrate;
    wherein the optical waveguide substrate includes:
        a polarization beam splitter configured to split the reception light into an X-polarized component and a Y-polarized component orthogonal to the X-polarized component,
        a beam splitter configured to split the local light,
        a pair of optical hybrid circuits configured to cause the X-polarized component and the Y-polarized component to interfere with the split local light, respectively,
        a pair of local light waveguides configured to couple the beam splitter and the pair of optical hybrid circuits,
        a pair of reception light waveguides configured to couple the polarization beam splitter and the pair of optical hybrid circuits, and
        a transmission light waveguide which the transmission light passes,
    wherein the pair of local light waveguides and the transmission light waveguide are doped with a rare-earth ion that amplifies light having a predetermined frequency when the excitation light is introduced.

2. The optical module according to claim 1, further comprising:
    a transmission light output adjuster configured to adjust light output power of the transmission light in accordance with a transmission light control signal; and
    a processor configured to:
        supply an excitation light control signal indicating that light output power of the excitation light is increased to the excitation light source in a case where it is determined that reception characteristics of the reception light do not meet a predetermined condition and where it is determined that the light output power of the transmission light is larger than a predetermined light output power threshold value, and
        supply a transmission light control signal indicating that the light output power of the transmission light is decreased to the transmission light output adjuster.

3. The optical module according to claim 2,
    wherein the transmission light output adjuster is a variable optical attenuator mounted on the optical modulator.

4. The optical module according to claim 1,
    wherein the excitation light is introduced into the transmission light waveguide from a direction identical to the transmission light.

5. The optical module according to claim 1,
    wherein the excitation light is introduced into the transmission light waveguide from a direction opposite to the transmission light.

6. The optical module according to claim 1,
    wherein the rare-earth ion is an erbium ion.

7. The optical module according to claim 1,
    wherein the optical modulator is provided on the optical waveguide substrate.

8. A control method performed by a processor of an optical module, the control method comprising:
    demultiplexing, by a demultiplexer of the optical module, a light emitted from a light source of the optical module into a transmission light and a local light;
    determining whether or not reception characteristics of a reception light meet a predetermined condition;
    determining whether or not a light output power of the transmission light is equal to or smaller than a predetermined light output power threshold value;
    supplying an excitation light control signal indicating that a light output power of the excitation light is increased to a excitation light source when it is determined that the reception characteristics of the reception light do not meet the predetermined condition and when it is determined that the light output power of the transmission light is larger than the predetermined light output power threshold value; and
    supplying a transmission light control signal indicating that the light output power of the transmission light is decreased to a transmission light output adjuster,
    wherein the optical module includes:
        an optical modulator configured to modulate the transmission light;
        an optical waveguide substrate configured to receive the transmission light modulated by the optical modulator, the local light, and a reception light;

an excitation light source configured to introduce the excitation light into the optical waveguide substrate;

wherein the optical waveguide substrate includes:

a polarization beam splitter configured to split the reception light into an X-polarized component and a Y-polarized component orthogonal to the X-polarized component, a beam splitter configured to split the local light, a pair of optical hybrid circuits configured to cause the X-polarized component and the Y-polarized component to interfere with the split local light, respectively, a pair of local light waveguides configured to couple the beam splitter and the pair of optical hybrid circuits, a pair of reception light waveguides configured to couple the polarization beam splitter and the pair of optical hybrid circuits, and a transmission light waveguide which the transmission light passes, wherein the pair of local light waveguides and the transmission light waveguide are doped with a rare-earth ion that amplifies light having a predetermined frequency when the excitation light is introduced.

* * * * *